(12) United States Patent
Han

(10) Patent No.: US 6,988,234 B2
(45) Date of Patent: Jan. 17, 2006

(54) APPARATUS AND METHOD FOR MEMORY SHARING BETWEEN INTERLEAVER AND DEINTERLEAVER IN A TURBO DECODER

(75) Inventor: Tae-Hee Han, Seoul (KR)

(73) Assignee: Samsung Electronics Co., Ltd., (KR)

( * ) Notice: Subject to any disclaimer, the term of this patent is extended or adjusted under 35 U.S.C. 154(b) by 417 days.

(21) Appl. No.: 10/314,724

(22) Filed: Dec. 9, 2002

(65) Prior Publication Data

US 2004/0203723 A1    Oct. 14, 2004

(30) Foreign Application Priority Data

Dec. 7, 2001    (KR) ............... 10-2001-0077492

(51) Int. Cl.
*H03M 13/00*    (2006.01)
(52) U.S. Cl. .................... 714/755; 714/786
(58) Field of Classification Search ............. 714/752, 714/755, 786, 791–795; 341/81
See application file for complete search history.

(56) References Cited

U.S. PATENT DOCUMENTS

| | | | |
|---|---|---|---|
| 6,392,572 B1 * | 5/2002 | Shiu et al. | 341/81 |
| 6,574,766 B2 * | 6/2003 | Obuchi et al. | 714/755 |
| 6,732,327 B1 * | 5/2004 | Heinila | 714/792 |

* cited by examiner

*Primary Examiner*—Shelly Chase
(74) *Attorney, Agent, or Firm*—Dilworth & Barrese LLP

(57) ABSTRACT

An apparatus for memory sharing between an interleaver and a deinterleaver in a turbo decoder is disclosed. A memory writes therein data obtained by interleaving data decoded by a decoder and writes therein data obtained by deinterleaving the data decoded by the decoder, in response to a control signal. A controller reads the stored interleaved data for a delay time of the decoder, generates a first control signal for writing the interleaved signal in the memory after a lapse of the delay time, writes the deinterleaved data in the memory for the delay time, and generates a second control signal for reading the stored deinterleaved data after a lapse of the delay time.

4 Claims, 9 Drawing Sheets

APPARATUS AND METHOD FOR MEMORY SHARING BETWEEN INTERLEAVER AND DEINTERLEAVER IN A TURBO DECODER

PRIORITY

This application claims priority to an application entitled "Apparatus and Method for Memory Sharing Between Interleaver and Deinterleaver in a Turbo Decoder" filed in the Korean Industrial Property Office on Dec. 7, 2001 and assigned Serial No. 2001-77492, the contents of which are incorporated herein by reference herein.

BACKGROUND OF THE INVENTION

1. Field of the Invention

The present invention relates generally to a mobile communication system, and in particular, to an apparatus and method for memory sharing between an interleaver and a deinterleaver in a turbo decoder.

2. Description of the Related Art

In general, a digital communication system supports forward error correction (FEC) so that a receiver can correctly restore received data even though a transmission error has occurred in the received data. For the forward error correction, the commercialized CDMA (Code Division Multiple Access) communication system, e.g., the IS-95 system uses convolutional codes having strong restitution force against burst errors, and the next generation mobile communication system, e.g., the CDMA2000 or UMTS (Universal Mobile Telecommunications System) system uses turbo codes having more powerful error restitution force.

Now, a structure of a turbo coder will be described herein below with reference to FIG. 1.

FIG. 1 is a block diagram illustrating a structure of a common turbo coder. The turbo coder includes constituent coders supporting recursive systematic codes. Referring to FIG. 1, as a signal X(t), generated by adding CRC (Cyclic Redundancy Check) and tail bits to an input signal, is input to the turbo coder, namely, X(t) is provided in parallel to a first constituent coder 100 and a second constituent coder 150. The first constituent coder 100 and the second constituent coder 150 are activated by their control switches. The input to the second constituent coder 150 includes information bits interleaved by an interleaver 130. Upon receiving the input signal, the first constituent coder 100 and the second constituent coder 150 output X(t), $Y_0(t)$, $Y_1(t)$, $Y'_0(t)$, $Y'_1(t)$ and X'(t) by exclusive OR gates and shift registers. The signals output from the turbo coder, though not illustrated in FIG. 1, are sequentially applied to a symbol repeater or a puncturer, where they are repeated or punctured the signals output from the turbo coder according to a data rate.

The coded signals are decoded in a turbo decoder, and a structure of the turbo decoder will be described with reference to FIG. 2.

FIG. 2 is a block diagram illustrating a structure of a common turbo decoder. Since the turbo decoder has a recursive structure, an operation of the turbo decoder is also performed recursively, and at each iteration (or each iterative decoding process), a reliability to be used for the next iteration is calculated. Now, a decoding process by the turbo decoder will be described with reference to FIG. 2.

Referring to FIG. 2, the turbo decoder is comprised of a first decoder 211, an interleaver 213, a second decoder 215, and a deinterleaver 217. The signals X(t), $Y_0(t)$, $Y_1(t)$, $Y'_0(t)$ and $Y'_1(t)$ output from the turbo coder are applied to the turbo decoder. The X(t) is decoded by the first decoder 211, interleaved by the interleaver 213, and then stored in a RAM (Random Access Memory; not shown) of the interleaver 213. Here, the RAM of the interleaver 213 writes therein data interleaved by the interleaver 213. An output signal of the interleaver 213 is provided to the second decoder 215. The second decoder 215 performs decoding on the $Y'_0(t)$ and $Y'_1(t)$, and the decoding result of the first decoder 211, stored in the RAM of the interleaver 213.

The resultant data obtained by the second decoder 215 (namely, the decoding result data of the first decoder 211, stored in the RAM of the interleaver 213, and the signals $Y'_0(t)$ and $Y'_1(t)$ generated by interleaving the initial input signal), becomes decoded data obtained through one complete iteration (or one complete decoding process). The decoded data obtained through first iteration (or first iterative decoding process) is provided to the deinterleaver 217. The deinterleaver 217 writes the decoded data output from the second decoder 215, i.e., the decoded data obtained through first iteration, in a RAM (not shown) of the deinterleaver 217. The decoded data obtained through first iteration, written in the RAM of the deinterleaver 217, is provided to a hard decision block 219. The hard decision block 219 performs hard decision on the data output from the deinterleaver 217, and outputs decoded data.

Though not illustrated, the decoded data output from the hard decision block 219 is provided to a CRC checker. The CRC checker performs CRC checking on the hard decision value. As a result of the CRC checking, if no CRC error is detected, the turbo decoder ends the decoding process without further iterating the decoding process, and then generates an interrupt signal indicating completion of the decoding process. However, if a CRC error is detected, the turbo decoder iterates the turbo decoding process a preset number of times. Here, the number of iterating the decoding process is determined so as not to exceed a time period for which the current frame can be completely decoded before the next frame is received. Further, in FIG. 2, $Z_k$ represents data generated by feeding back the output data of the deinterleaver 217, for iterative decoding.

The first decoder 211 and the second decoder 215 have the same decoding scheme, and when realized by hardware, they require a large amount of logic components. Therefore, when the turbo decoder is actually realized by hardware, only one decoder is generally used, and for each iteration, the decoder is used twice.

A turbo decoder for performing turbo decoding by iteratively using a single decoder twice, and a timing diagram of the turbo decoder will be described with reference to FIGS. 3 and 4, respectively.

FIG. 3 is a block diagram illustrating an internal structure of a common turbo decoder having a single decoder. The turbo decoder illustrated in FIG. 3 has a decoder using RESOVA (Register Exchange Soft Out Viterbi Algorithm). The RESOVA is a decoding algorithm for minimizing codeword error probability. Unlike the turbo decoder described in conjunction with FIG. 2, the turbo decoder of FIG. 3 includes a single decoder, i.e., a RESOVA decoder 311. In addition, the turbo decoder includes a data sampler 313 for performing sampling on input data, delays 315 and 317 for delaying output data of the data sampler 313 for a predetermined time, a RESOVA post 319, an interleaver 321, a deinterleaver 323, an output buffer 325, and a CRC checker 327.

Referring to FIG. 3, received data ch_deint_do is applied to the data sampler 313, and the data sampler 313 samples the received data ch_deint_do and provides its output to the RESOVA decoder 311. The RESOVA decoder 311 then decodes an output signal of the data sampler 313 by RESOVA, and provides its output to the interleaver 321 through the RESOVA post 319. The interleaver 321 then writes output data of the RESOVA post 319 in a RAM (not shown) included therein, and provides the data written in its RAM to the data sampler 313. The data sampler 313 then re-samples the output data of the interleaver 321, and provides its output to the RESOVA decoder 311. The RESOVA decoder 311 then decodes the output data of the data sampler 313 by RESOVA, and provides its output to the deinterleaver 323 through the RESOVA post 319. The deinterleaver 323 deinterleaves an output signal of the RESOVA post 319, and writes the deinterleaved data in a RAM (not shown) thereof, completing one iteration. The data written in the RAM of the deinterleaver 323 is buffered in the output buffer 325. Further, the data written in the RAM of the deinterleaver 323 is subject to CRC checking in the CRC checker 327. As a result of the CRC checking, if no CRC error is detected, the turbo decoder ends the decoding process without further iterating the decoding, and then generates an interrupt signal indicating completion of the decoding process. However, if a CRC error is detected by the CRC checker 327, the turbo decoder iterates the decoding process a preset number of times. Here, the number of iterating the decoding process is determined so as not to exceed a time period for which the current frame can be completely decoded before the next frame is received.

Next, operation timing of the turbo decoder illustrated in FIG. 3 will be described with reference to FIG. 4.

FIG. 4 is a timing diagram illustrating operation timing of the turbo decoder shown in FIG. 3. In the timing diagram of FIG. 4, one complete decoding process is performed through two iterative decoding processes. In FIG. 4, "DEC1" represents a period where a first decoding process is performed, and "DEC2" represents a period where a second decoding process is performed. Further, it is noted in FIG. 4 that a period where data is written in the RAM of the interleaver is identical to a period where data is written in the RAM of the deinterleaver. That is, an operation of writing data in the RAM of the interleaver and an operation of reading data in the RAM of the deinterleaver are performed simultaneously. Therefore, the interleaver and the deinterleaver must be realized with separate logics and memories. This means that in the decoding process, an operation of writing data in the interleaver memory and at the same time, reading data stored in the deinterleaver memory, or an operation of writing data in the deinterleaver memory and at the same time, reading data stored in the interleaver memory cannot be supported by a single hardware structure, i.e., a general logic and memory structure operating in response to a single clock.

However, it can be noted that the operation of writing data in each memory of the interleaver and the deinterleaver and the operation of reading data stored in the memory are exclusive. This will be described with reference to FIGS. 5A and 5B.

FIG. 5A is a timing diagram illustrating operations of an interleaver and a deinterleaver during an odd-numbered decoding process by the turbo decoder of FIG. 3.

Referring to FIG. 5A, a process of writing data in the memory, or RAM of the interleaver 321 and reading data stored in the memory of the deinterleaver 323 is performed in an odd-numbered decoding process of the turbo decoder. Here, a synchronous SRAM (Static RAM) is typically used for the memories of the interleaver 321 and the deinterleaver 323. In the timing diagram of FIG. 5A, there exists a time lag (or delay) L, caused by the RESOVA decoder 311, between an operation of writing data in the memory of the interleaver 321 and an operation of reading data stored in the memory of the deinterleaver 323.

For both the operation of writing data in the memory of the interleaver 321 and the operation of reading data stored in the memory of the deinterleaver 323, memory addresses are sequentially generated. That is, during writing, data is sequentially written in the memory of the interleaver 321 by increasing the address one by one beginning at an address #0 (or "A"). Likewise, during reading, data is sequentially read from the memory of the deinterleaver 323 by increasing the address one by one beginning at an address #0. Therefore, the data to be read is not damaged by the writing operation.

Next, an even-numbered decoding process by the turbo decoder of FIG. 3 will be described with reference to FIG. 5B.

FIG. 5B is a timing diagram illustrating operations of an interleaver and a deinterleaver during an even-numbered decoding process by the turbo decoder of FIG. 3.

Referring to FIG. 5B, a process of reading data stored in the memory, or RAM of the interleaver 321 and writing data in the memory of the deinterleaver 323 is performed in an even-numbered decoding process of the turbo decoder. Here, a synchronous SRAM is typically used for the memories of the interleaver 321 and the deinterleaver 323. In the timing diagram of FIG. 5B, there exists a time delay L, caused by the RESOVA decoder 311, between an operation of reading data stored in the memory of the interleaver 321 and an operation of writing data in the memory of the deinterleaver 323.

For both the operation of reading data stored in the memory of the interleaver 321 and the operation of writing data in the memory of the deinterleaver 323, memory addresses are generated in the same order. Therefore, as described in conjunction with FIG. 5A, the data to be read is not damaged by the writing operation. However, unlike the odd-numbered decoding process, the even-numbered decoding process does not sequentially generate the memory addresses.

As described above, the turbo decoder includes an interleaver and a deinterleaver for performing decoding on the received data, and the interleaver and the deinterleaver include separate memories for iterative data writing and reading, causing a reduction in efficiency of the hardware logic and memory. For a improvement of a reduction in efficiency of the hardware logic and memory, there have been demands for a definition of new operation timing for the interleaving and deinterleaving operations of the turbo decoder.

SUMMARY OF THE INVENTION

It is, therefore, an object of the present invention to provide an apparatus and method for memory sharing between an interleaver and a deinterleaver in a turbo decoder.

To achieve the above and other objects, the present invention provides an apparatus for memory sharing between an interleaver and a deinterleaver in a turbo decoder. A memory reads and writes therein data obtained by interleaving data decoded by a decoder and reads and writes therein data obtained by deinterleaving the data decoded by the decoder, in response to a control signal. A controller control to read the stored deinterleaved data for a delay time of the decoder, and control to sequentially read the deinterleaved data and write the interleaved signal in the memory after a lapse of the delay time. The controller also control to read the deinterleaved data in the memory for the delay time, and control to sequentially write the deinterleaved data and read the stored interleaved data after a lapse of the delay time.

To achieve the above and other objects, the present invention provides a method for memory sharing between an interleaver and a deinterleaver in a turbo decoder including a memory for reading and writing therein data obtained by interleaving data decoded by a decoder and reading and writing therein data obtained by deinterleaving the data decoded by the decoder in response to a control signal. The method comprises reading the deinterleaved data stored in the memory for a delay time of the decoder, and sequentially reading the deinterleaved data and writing the interleaved data in the memory after a lapse of the delay time; and reading the interleaved data in the memory for the delay time, and sequentially writing the deinterleaved data and reading the interleaved data stored in the memory after a lapse of the delay time.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 6:
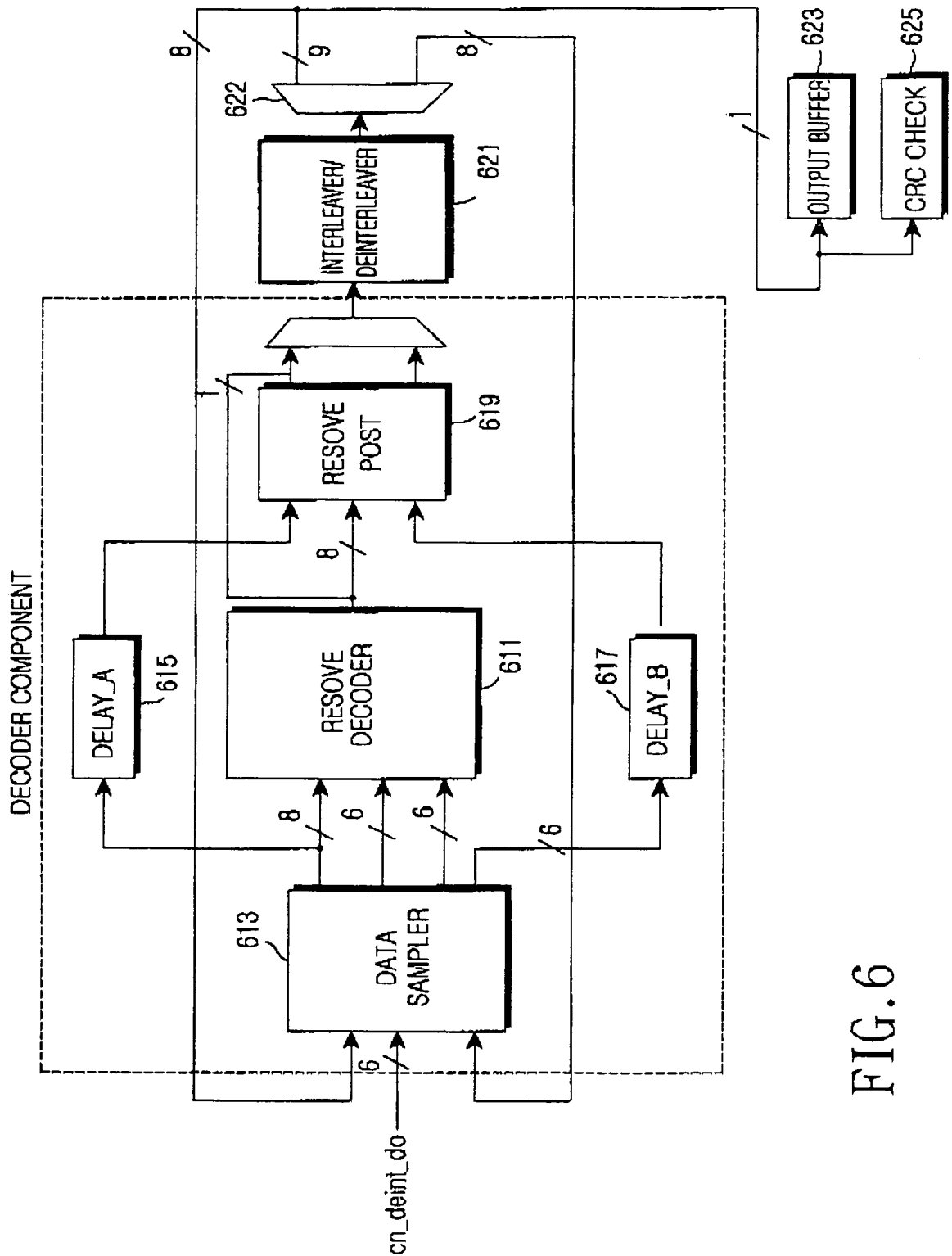
FIG. 6 is a block diagram illustrating an internal structure of a turbo decoder according to an embodiment of the present invention.

FIG. 6 is a block diagram illustrating an internal structure of a turbo decoder according to an embodiment of the present invention. The turbo decoder illustrated in FIG. 6 has a decoder using RESOVA (Register Exchange Soft Out Viterbi Algorithm). The RESOVA is a decoding algorithm for minimizing codeword error probability. The turbo decoder of FIG. 6 includes a single decoder, i.e., a RESOVA decoder 611. In addition, the turbo decoder includes a data sampler 613 for performing sampling on input data, delays 615 and 617 for delaying output data of the data sampler 613 for a predetermined time, a RESOVA post 619, a composite interleaver/deinterleaver 621, a demultiplexer (DEMUX) 622, an output buffer 623, and a CRC checker 625.

Referring to FIG. 6, received data ch__deint__do is applied to the data sampler 613, and the data sampler 613 samples the received data ch__deint__do and provides its output to the RESOVA decoder 611. The RESOVA decoder 611 then decodes an output signal of the data sampler 613 by RESOVA, and provides its output to the interleaver/deinterleaver 621 through the RESOVA post 619. The interleaver/deinterleaver 621, since it serves as an interleaver at first iteration, writes interleaved data in a RAM (not shown) included therein, and then provides the data written in the RAM to the data sampler 613. However, when the interleaver/deinterleaver 621 serves as a deinterleaver at the next iteration, the interleaver/deinterleaver 621 deinterleaves its input data, and then writes the deinterleaved data in the memory or reads the data stored in the memory. The interleaver/deinterleaver 621 utilizes a shared memory, and the memory sharing method will be described later in detail with reference to FIG. 7.

An output signal of the interleaver/deinterleaver 621 is demultiplexed by the demultiplexer 622, and then provided to the data sampler 613. The data sampler 613 re-samples the output data of demultiplexer 622, and provides its output to the RESOVA decoder 611. The RESOVA decoder 611 then decodes the output data of the data sampler 613 by RESOVA, and provides its output to the interleaver/deinterleaver 621 through the RESOVA post 619. In the second decoding process (or at second iteration), the interleaver/deinterleaver 621 deinterleaves an output signal of the RESOVA post 619, and writes the deinterleaved data in the memory thereof, completing one complete iteration (one complete iterative decoding process). The data written in the memory of the interleaver/deinterleaver 621 is buffered in the output buffer 623. Further, the data written in the memory of the interleaver/deinterleaver 621 is subject to CRC checking in the CRC checker 625. As a result of the CRC checking, if no CRC error is detected, the turbo decoder ends the decoding process without further iterating the decoding, and then generates an interrupt signal indicating completion of the decoding process. However, if a CRC error is detected by the CRC checker 625, the turbo decoder iterates the decoding process a preset number of times. Here, the number of iterating the decoding process is determined so as not to exceed a time period for which the current frame can be completely decoded before the next frame is received.

As a result, in the turbo decoder described in conjunction with FIG. 6, an interleaver and a deinterleaver share a memory, so the interleaver and the deinterleaver are integrated into one hardware structure. The hardware integration due to memory sharing contributes to a reduction in capacity of about 24 Kbits of the synchronous SRAM in a turbo decoder for, for example, a CDMA2000 1× system supporting a data rate of a maximum of 153.6 Kbps. The reduced capacity is calculated on the assumption that the number of words required by the interleaver/deinterleaver 621 is 3,072 (153.6 Kbps*20 ms) and each word has an 8-bit length.

Next, a memory sharing method for the interleaver/deinterleaver 621 of FIG. 6 will be described with reference to FIG. 7.

Figure 7:
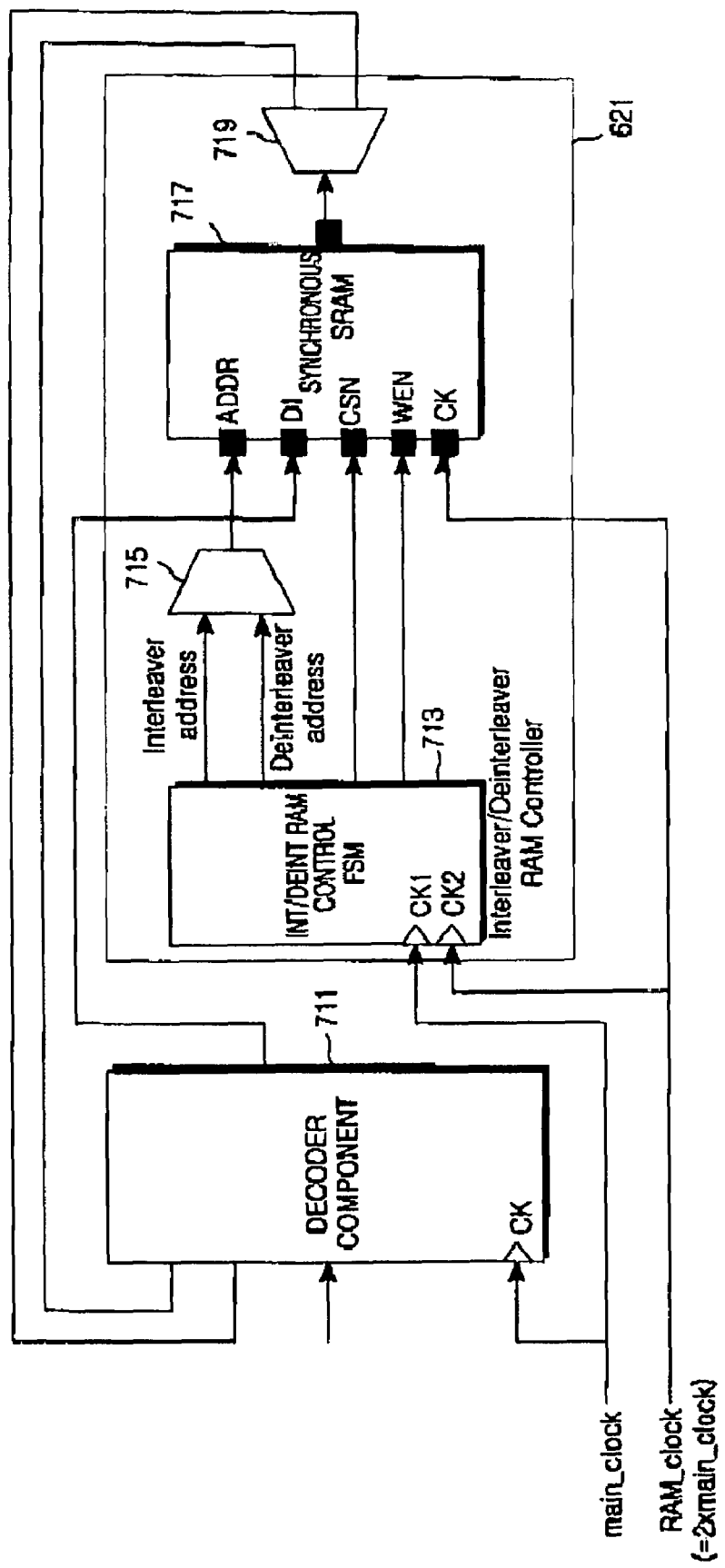
FIG. 7 is a block diagram illustrating an internal structure of the interleaver/deinterleaver of FIG. 6.

FIG. 7 is a block diagram illustrating an internal structure of the interleaver/deinterleaver 621 of FIG. 6. Specifically, FIG. 7 illustrates a structure of the interleaver/deinterleaver 621, wherein an interleaver is integrated with a deinterleaved in a turbo decoder for a CDMA2000 1× system supporting a data rate of a maximum of 153.6 Kbps. The interleaver/deinterleaver 621 includes a synchronous SRAM 717 for storing data, a controller (interleaver/deinterleaver controller) 713 for controlling an operation of writing data in the synchronous SRAM 717 and an operation of reading data stored in the synchronous SRAM 717, a multiplexer (MUX) 715 for multiplexing address signals, i.e., interleaver address and deinterleaver address, output from the controller 713, and a demultiplexer (DEMUX) 719 for demultiplexing an output signal of the synchronous SRAM 717.

In order to maintain overall decoding timing of the turbo decoder, the controller 713 and the synchronous SRAM 717 require a RAM_clock which is identical to phase of a main clock provided to a decoder 711 and two times faster than the main_clock provided to a decoder 711. Now, an operation of the interleaver/deinterleaver 621 shown in FIG. 7 will be described with reference to FIGS. 8A and 8B.

Figure 8A:
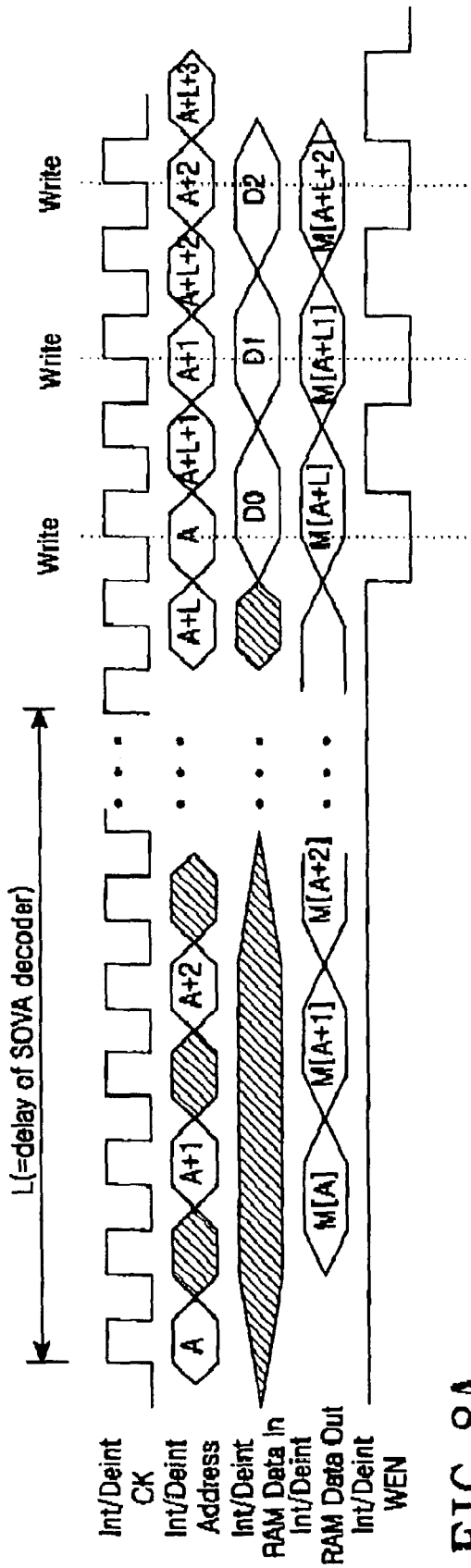
FIG. 8A is a RAM timing diagram for an operation of reading a deinterleaver RAM and writing data in an interleaver RAM in FIG. 7.

FIG. 8A is a RAM timing diagram for an operation of reading a deinterleaver RAM and writing data in an interleaver RAM as described in conjunction with FIG. 7.

Referring to FIG. 8A, first, an operation of reading data from the interleaver/deinterleaver 621 is performed for a delay time L of the RESOVA decoder 611. In this case, data input to the synchronous SRAM 717 is "don't care" data, because it is impossible to perform a write operation as a WEN (Write Enable) signal is logically high. Further, the synchronous SRAM 717 generates data of an address latched to a rising edge of the RAM_clock after a lapse of a delay time (which is the sum of a time required for accessing the synchronous SRAM 717 for reading data and a time required for outputting data by the synchronous SRAM 717 after receiving the address). The delay time is changed according to a characteristic of the memory. For the same address, output data of the synchronous SRAM 717 is valid for 2 periods of the RAM_clock. As stated above, since the RAM_clock provides the same timing as the clock used for the conventional turbo decoder having two synchronous SRAMs, the RAM_clock is two times faster than the main_clock for driving the decoder 711.

Next, an operation of writing the data interleaved by the interleaver/deinterleaver 621 in the synchronous SRAM 717 is performed after a lapse of the delay time L of the RESOVA decoder 611. In this case, for the addresses of the synchronous SRAM 717, the controller 713 alternately generates an address for reading data from the synchronous SRAM 717 and an address for writing data in the synchronous SRAM 717. The data written in the synchronous SRAM 717 is the data output from the decoder 711, and is valid for 2 periods of the RAM_clock. At this moment, the WEN is activated to a logical low state only for a period for writing the interleaved data, and even though data is received for the period where the WEN is activated to the logical low state, the received data is written only in a valid address.

A comparison will be made between the proposed process of reading a deinterleaver RAM and writing data in an interleaver RAM by the interleaver/deinterleaver 621, described in conjunction with FIG. 8A, and the conventional interleaving/deinterleaving process of FIG. 5A during the odd-numbered decoding process in the turbo decoding process in the case where an interleaver and a deinterleaver are designed with separate hardware logics and an interleaver RAM and a deinterleaver RAM are realized with separate memories.

Figure 1:
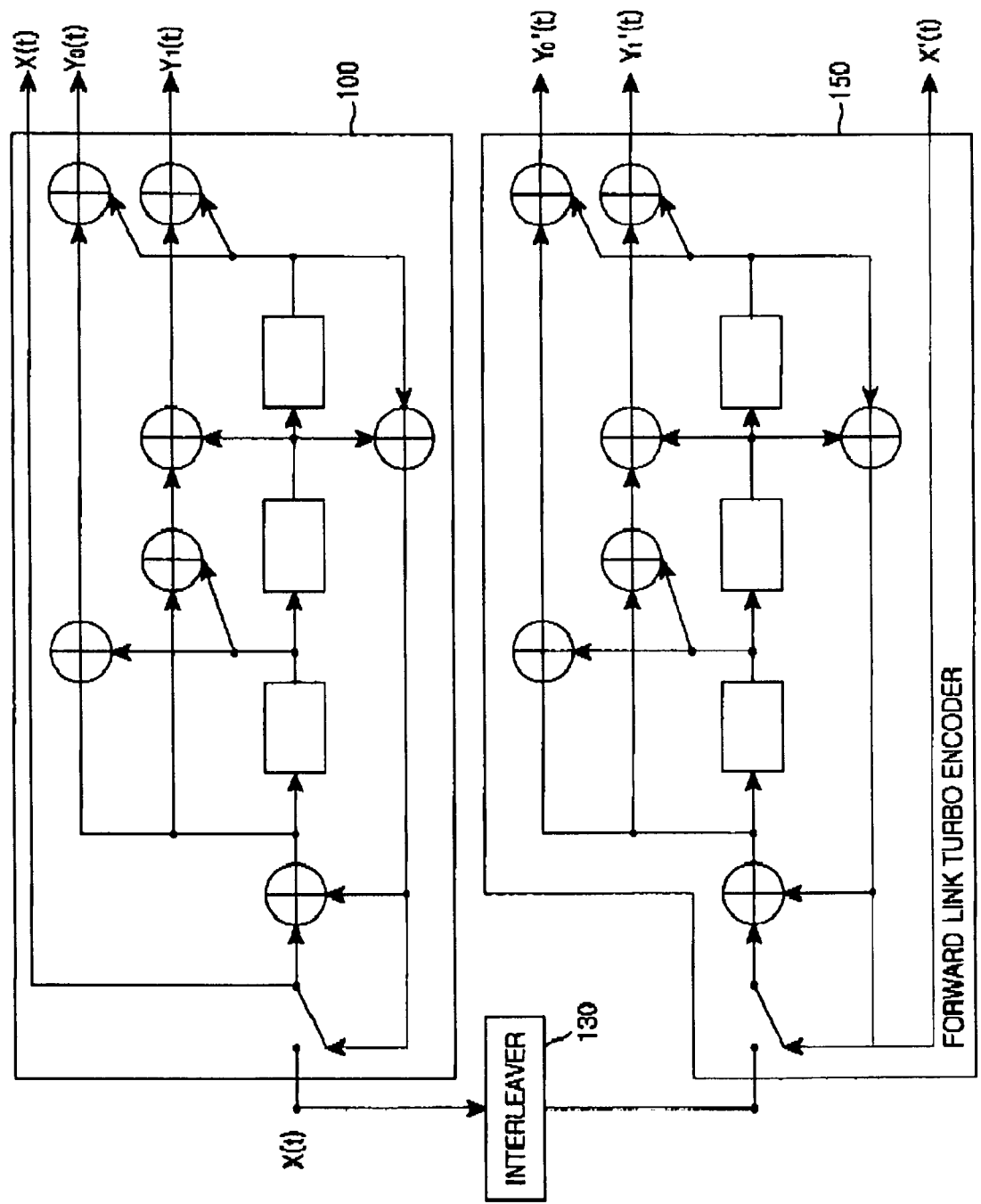
FIG. 1 is a block diagram illustrating a structure of a common turbo coder.
Figure 2:
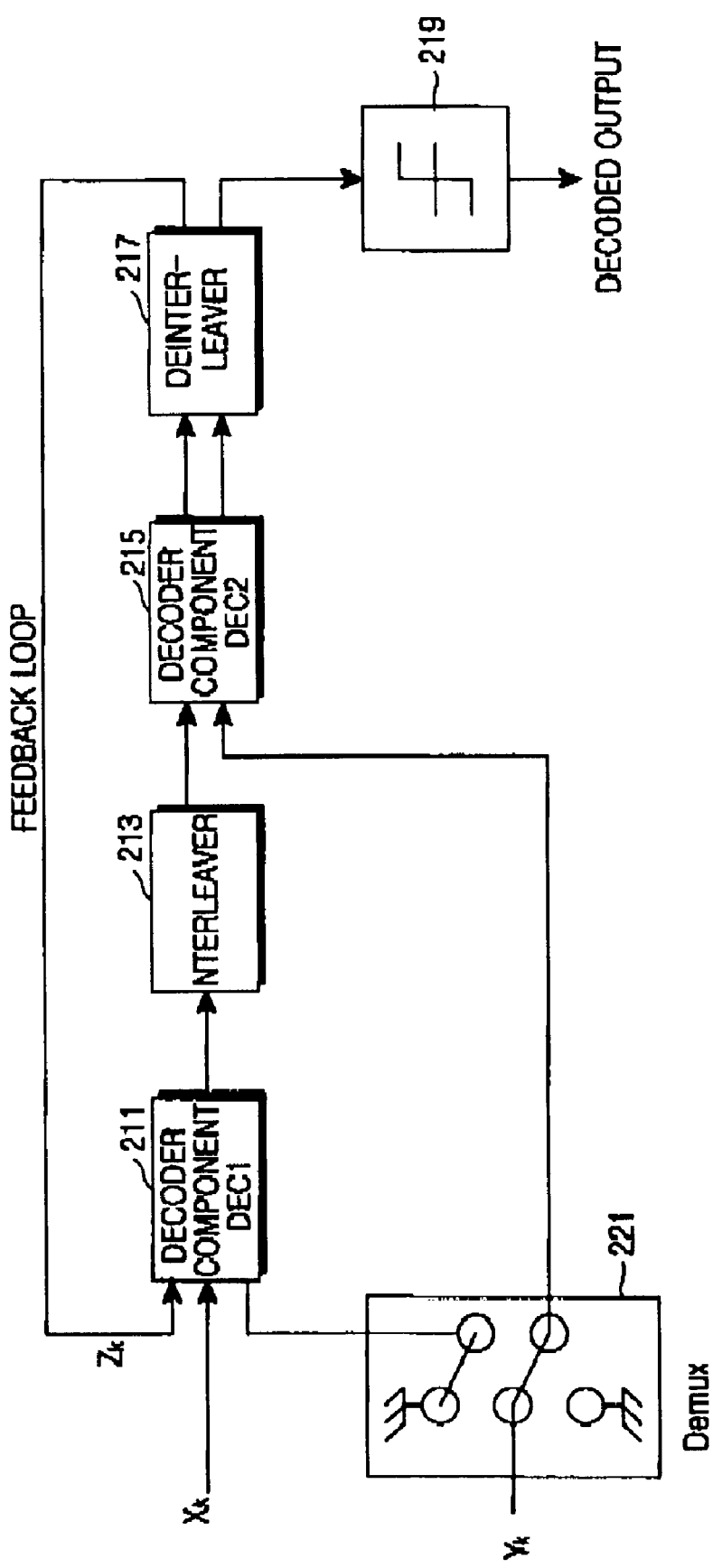
FIG. 2 is a block diagram illustrating a structure of a common turbo decoder.
Figure 3:
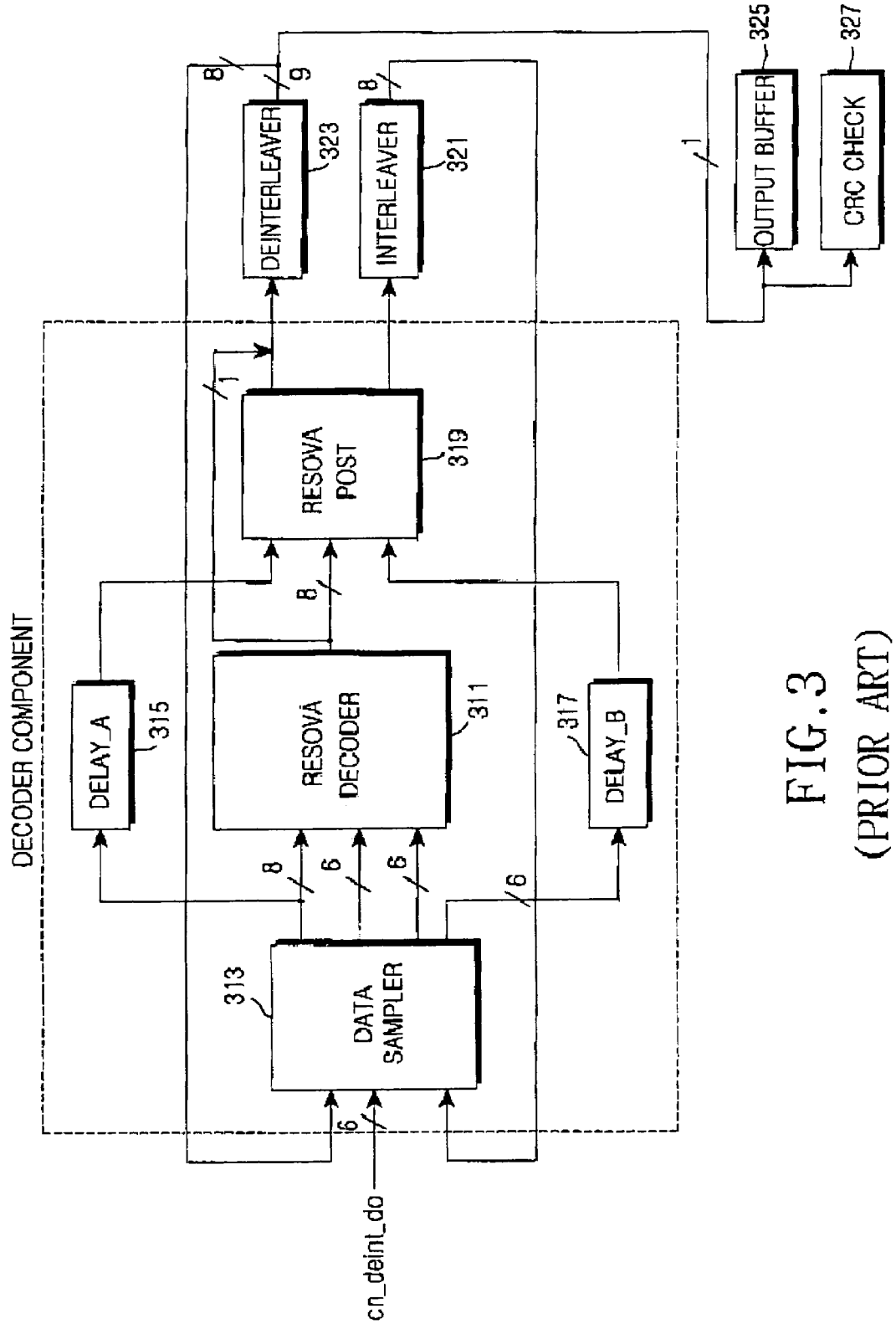
FIG. 3 is a block diagram illustrating an internal structure of a common turbo decoder having a single decoder.
Figure 4:
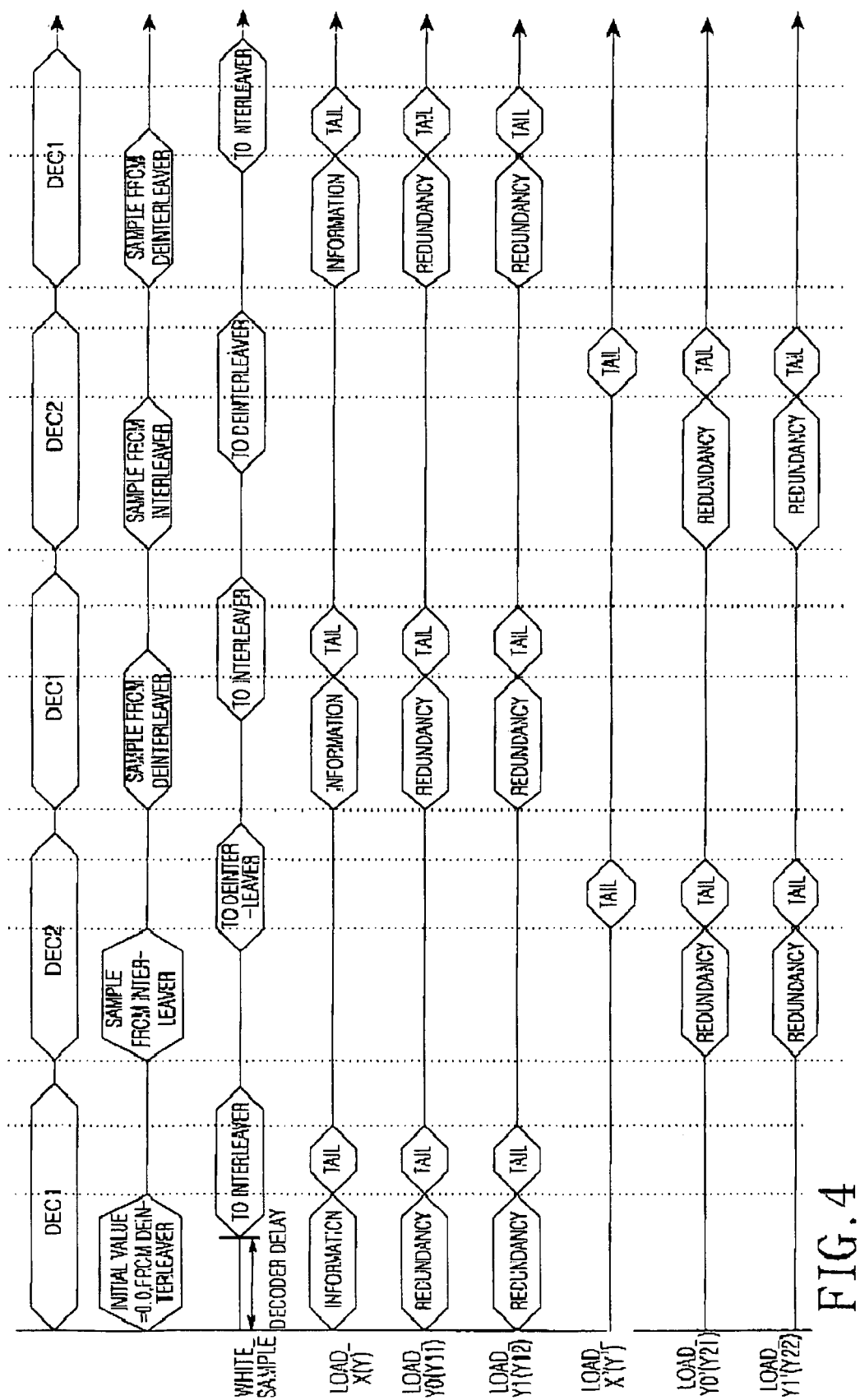
FIG. 4 is a timing diagram illustrating operation timing of the turbo decoder shown in FIG. 3.
Figure 5A:
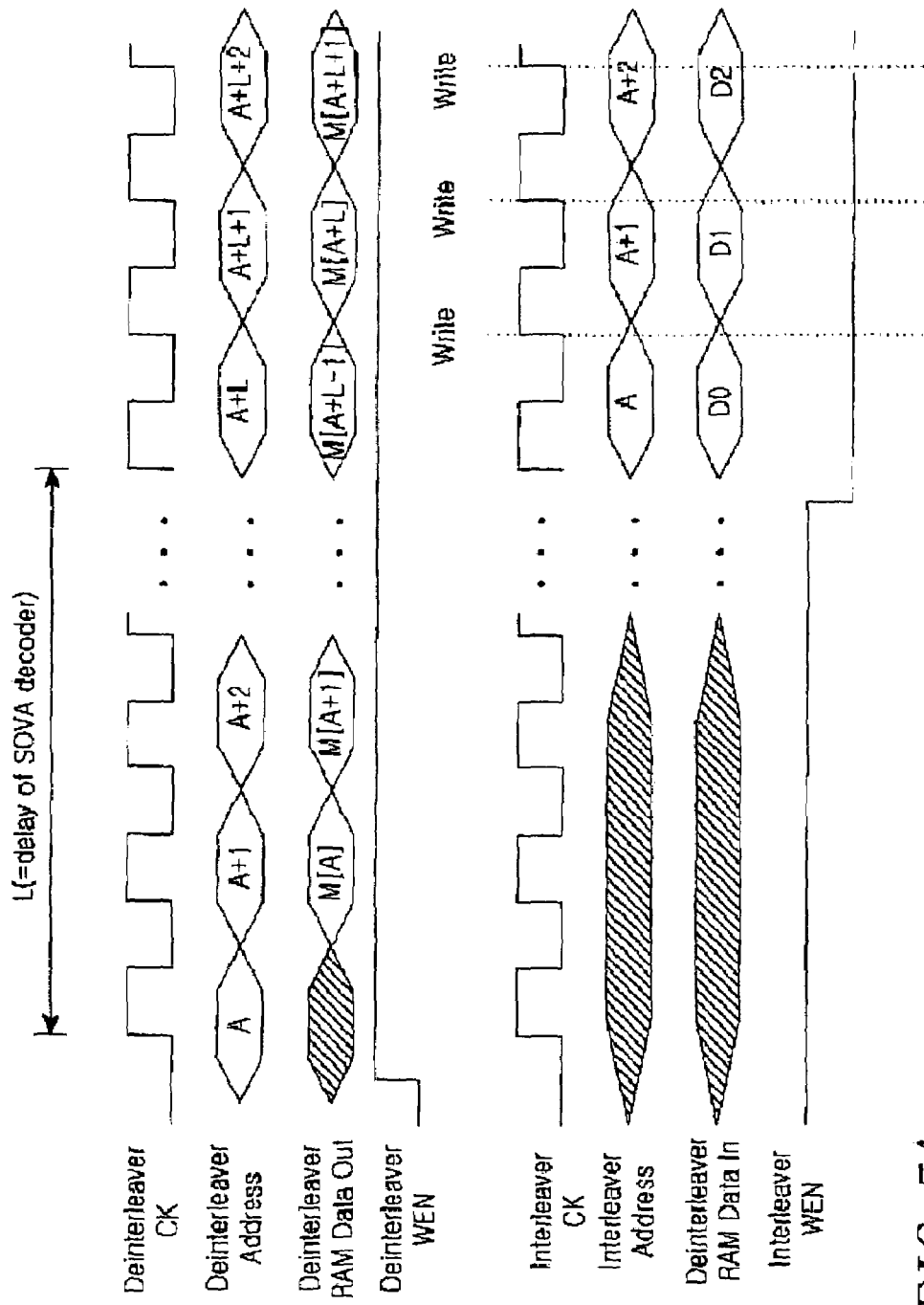
FIG. 5A is a timing diagram illustrating operations of an interleaver and a deinterleaver during an odd-numbered decoding process by the turbo decoder of FIG. 3.

First, when writing data in the interleaver RAM and at the same time, reading data stored in the deinterleaver RAM, the RAM addresses are sequentially generated in the same order in both FIG. 8A and FIG. 5A. That is, when RAM is accessed every clock, data is read in the order of #1, #2, #3, . . . beginning at an address #0 (or "A"), and data is sequentially written in the order of #0, #1, #2, #3, . . . after a lapse of the delay time L. Therefore, it is possible to prevent a write operation and a read operation from being simultaneously performed, thereby preventing a data loss.

With reference to FIG. 8A, the RAM timing diagram for an operation for reading a deinterleaver RAM and writing data in an interleaver RAM has been described. Next, a timing diagram for an operation of reading an interleaver RAM and writing data in a deinterleaver RAM will be described with reference to FIG. 8B.

Figure 8B:
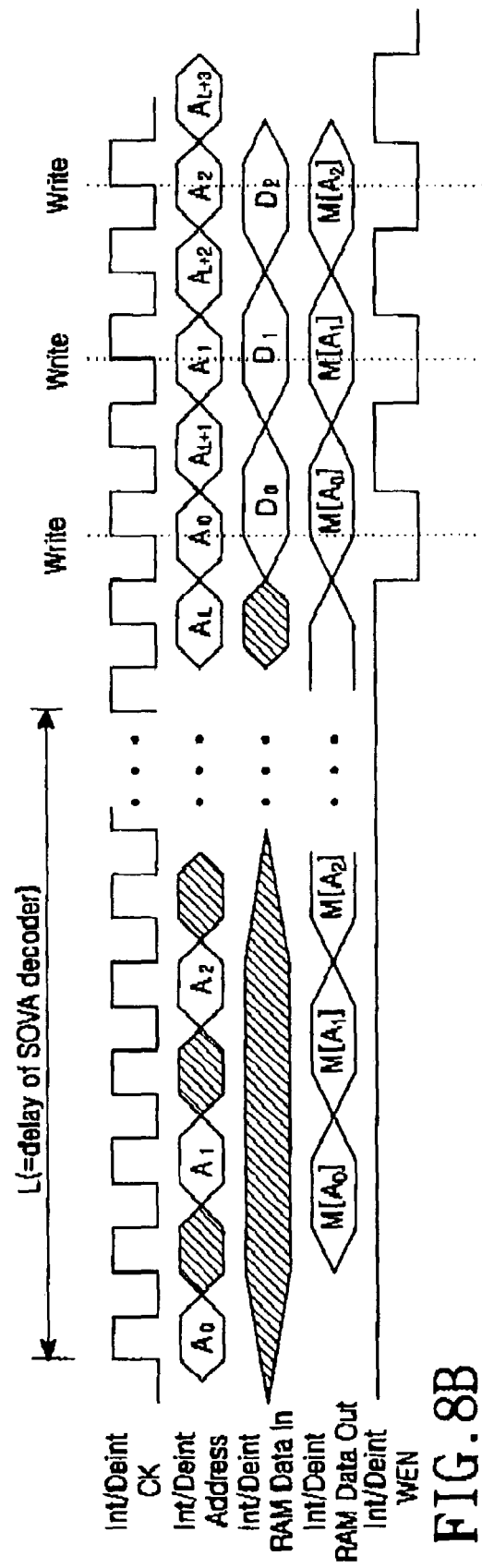
FIG. 8B is a timing diagram for an operation of reading an interleaver RAM and writing data in a deinterleaver RAM in FIG. 7.

FIG. 8B is a timing diagram for an operation of reading data in an interleaver RAM and writing data in a deinterleaver RAM as described in conjunction with FIG. 7.

Figure 5B:
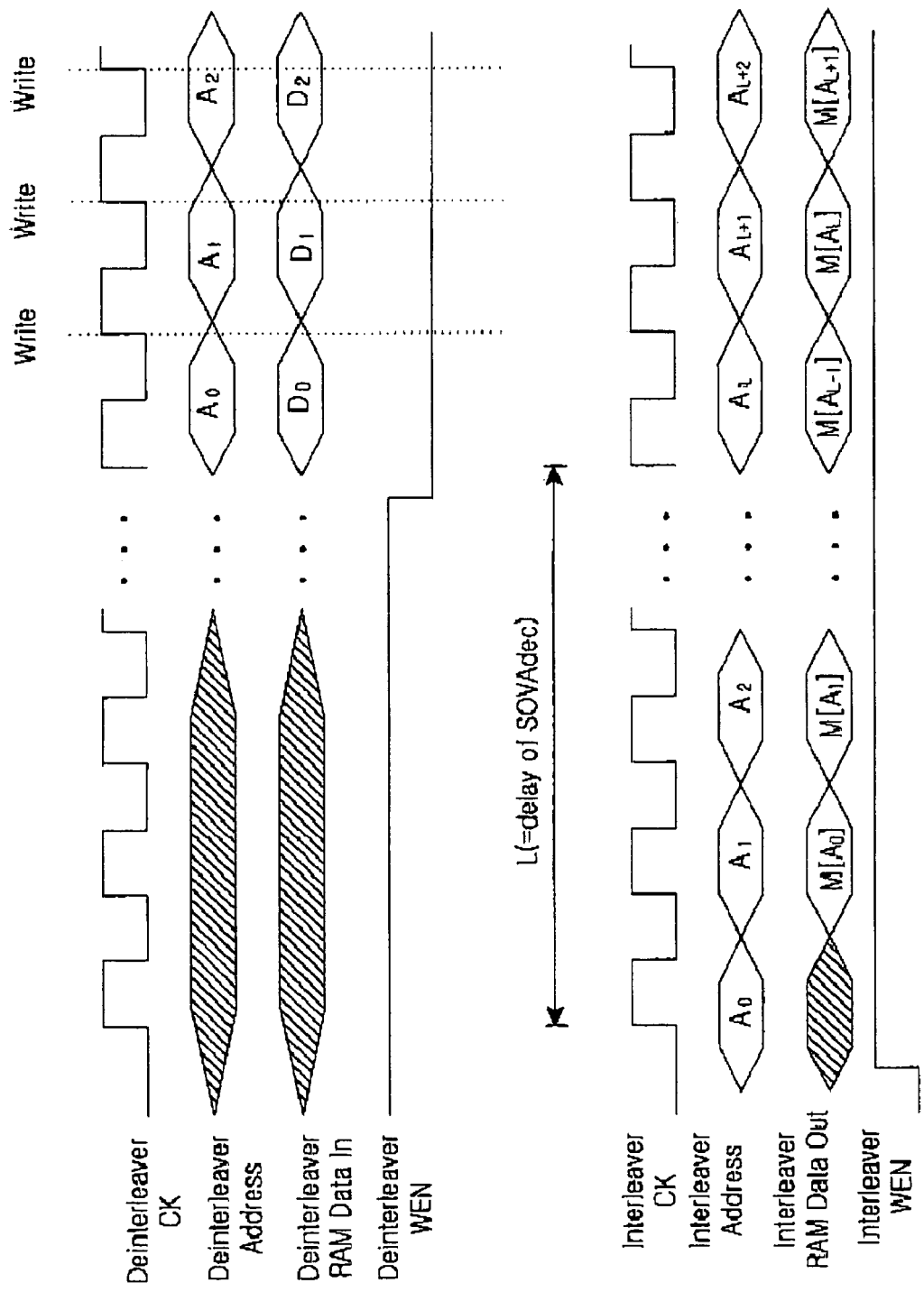
FIG. 5B is a timing diagram illustrating operations of an interleaver and a deinterleaver during an even-numbered decoding process by the turbo decoder of FIG. 3.

Referring to FIG. 8B, the operation is performed opposite to the operation described in conjunction with FIG. 8A. When writing data in the deinterleaver RAM and at the same time, reading data stored in the interleaver RAM, the RAM addresses are generated into partially reversed bits not sequentially but randomly in the same order by the interleaving technique. The proposed operation timing of FIG. 8B for writing data in the deinterleaver RAM and at the same time, reading data stored in the interleaver RAM is identical to conventional interleaving/deinterleaving operation timing of FIG. 5B during the even-numbered decoding process in the turbo decoding process in the case where an interleaver and a deinterleaver are designed with separate hardware logics and an interleaver RAM and a deinterleaver RAM are realized with separate memories. That is, an operation of writing data in the deinterleaver RAM and an operation of reading data stored in the interleaver RAM are performed in the same order separated by a specific delay time, instead of being simultaneously performed in the same address, thus preventing a mutual data loss. That is, the controller 713 enables RAM sharing between the interleaver and the deinterleaver by multiplexing addresses of the synchronous SRAM 717 and controlling the WEN signal.

Summarizing, in a mobile communication system supporting high-speed data transmission, the proposed turbo decoder for turbo decoding received data realizes an interleaver and a deinterleaver with a single logic, and the interleaver and the deinterleaver share the same memory, contributing to a reduction in overall hardware size. Therefore, as the data rate is increased higher, the hardware size reduction effect is also increased higher.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An apparatus for memory sharing between an interleaver and a deinterleaver in a turbo decoder, the apparatus comprising:

a memory for reading and writing therein data obtained by interleaving data decoded by a decoder and reading and writing therein data obtained by deinterleaving the data decoded by the decoder, in response to a control signal; and a controller for a control of reading the stored interleaved data for a delay time of the decoder, and for control of sequentially reading the stored interleaved data and writing the interleaved data in the memory after a lapse of the delay time, the controller for a control of writing the deinterleaved data in the memory for the delay time, and for control of sequentially writing the deinterleaved data and reading the stored deinterleaved data after a lapse of the delay time, wherein a clock provided to the controller and the memory is a predetermined number of times faster than a clock provided to the decoder.

2. The apparatus of claim 1, wherein the controller sequentially generates an address for writing data in the memory and an address for reading data stored in the memory, the address for writing data being different from the address for reading data.

3. A method for memory sharing between an interleaver and a deinterleaver in a turbo decoder including a memory for reading and writing therein data obtained by interleaving data decoded by a decoder and reading and writing therein data obtained by deinterleaving the data decoded by the decoder in response to a control signal, the method comprising the steps of:

reading the deinterleaved data stored in the memory for a delay time of the decoder, and sequentially reading the deinterleaved data and writing the interleaved data in the memory after a lapse of the delay time; and reading the interleaved data in the memory for the delay time, and sequentially writing the deinterleaved data and reading the interleaved data stored in the memory after a lapse of the delay time, wherein a clock provided to the memory is a predetermined number of times faster than a clock provided to the decoder.

4. The method of claim 3, wherein an address for writing data in the memory and an address for reading data stored in the memory, are sequentially generated and are not identical to each other.

* * * * *